(12) United States Patent
Staples

(10) Patent No.: US 11,602,182 B2
(45) Date of Patent: Mar. 14, 2023

(54) GLOVE WITH INTEGRATED VOLTAGE DETECTOR

(71) Applicant: Grant Edward Staples, Taylors Beach (AU)

(72) Inventor: Grant Edward Staples, Taylors Beach (AU)

( * ) Notice: Subject to any disclaimer, the term of this patent is extended or adjusted under 35 U.S.C. 154(b) by 408 days.

(21) Appl. No.: 17/049,396

(22) PCT Filed: Dec. 31, 2019

(86) PCT No.: PCT/IB2019/001379
§ 371 (c)(1),
(2) Date: Oct. 21, 2020

(87) PCT Pub. No.: WO2021/136951
PCT Pub. Date: Jul. 8, 2021

(65) Prior Publication Data
US 2022/0256954 A1 Aug. 18, 2022

(51) Int. Cl.
*A41D 19/00* (2006.01)
*A41D 19/015* (2006.01)
(Continued)

(52) U.S. Cl.
CPC ... *A41D 19/0027* (2013.01); *A41D 19/01594* (2013.01); *G01R 19/0046* (2013.01); *G01R 19/0084* (2013.01); *G01R 19/155* (2013.01)

(58) Field of Classification Search
CPC ............... G01R 19/00; G01R 19/0046; G01R 19/0084; G01R 19/0092; G01R 19/145;
(Continued)

(56) References Cited

U.S. PATENT DOCUMENTS 9,939,468 B1 4/2018 Dyszel
10,247,763 B1 4/2019 Wu et al.
(Continued)

FOREIGN PATENT DOCUMENTS

CN 202980268 U 6/2013
CN 204409675 U 6/2015
(Continued)

OTHER PUBLICATIONS

PCT International Search Report for corresponding International Application No. PCT/IB2019/001379 dated Sep. 28, 2020 (3 pages).
(Continued)

*Primary Examiner* — Hoai-An D. Nguyen
(74) *Attorney, Agent, or Firm* — Clark Hill PLC

(57) ABSTRACT

The inventive glove provides a work glove that detects the presence of AC voltage without compromising its usability as a work glove. Embodiments of the inventive glove include monopole aerials extending into the fingers of the glove. A thin flexible dielectric layer sits between the aerials and inside of the glove, acting as an electrical barrier between the aerials and the user's hand. The aerials are connected to conventional voltage detector circuitry on a circuit board located on the back of the glove. The circuit board is grounded to the user's wrist, which enhances the circuitry's ability to detect the presence of nearby AC voltage at a safe distance.

20 Claims, 3 Drawing Sheets

(51) Int. Cl.
*G01R 19/00* (2006.01)
*G01R 19/155* (2006.01)

(58) Field of Classification Search
CPC .. G01R 19/155; A41D 19/00; A41D 19/0006; A41D 19/001; A41D 19/0024; A41D 19/0027; A41D 19/015; A41D 19/01594
USPC .............................................. 324/76.11, 133
See application file for complete search history.

(56) References Cited

U.S. PATENT DOCUMENTS

| | | | |
|---|---|---|---|
| 10,488,174 | B2 | 11/2019 | Chen et al. |
| 2011/0234414 | A1 | 9/2011 | Ojeda et al. |
| 2016/0025682 | A1 | 1/2016 | Walker et al. |
| 2016/0095369 | A1* | 4/2016 | Roberts ............... H05B 3/34 2/160 |
| 2016/0209448 | A1 | 7/2016 | Currie et al. |
| 2017/0099888 | A1 | 4/2017 | Flynn |
| 2019/0101573 | A1 | 4/2019 | Wu et al. |
| 2019/0242523 | A1 | 8/2019 | Hanf et al. |
| 2021/0199699 | A1* | 7/2021 | Casillas ................ A41D 1/002 |

FOREIGN PATENT DOCUMENTS

| | | |
|---|---|---|
| CN | 104569561 A | 5/2019 |
| JP | 2010203961 A | 5/2019 |
| WO | 2014158030 A1 | 10/2014 |
| WO | 2018183558 A1 | 10/2018 |

OTHER PUBLICATIONS

PCT International Search Report for corresponding International Application No. PCT/IB2020/057572 dated Aug. 12, 2020 (3 pages).
PCT Written Opinion of the International Searching Authority for corresponding International Application No. PCT/IB2020/057572 dated Nov. 12, 2020 (4 pages).
PCT Written Opinion of the International Searching Authority for corresponding International Application No. PCT/IB2019/001379 dated Sep. 28, 2020 (8 pages).

* cited by examiner

GLOVE WITH INTEGRATED VOLTAGE DETECTOR

RELATED APPLICATIONS

This application claims the benefit of PCT/IB2019/001379.

BACKGROUND OF THE INVENTION

The commercial use of alternating current (AC) has been changing the world for more than a century and is a major driver for all modern growth in the world. Residences, office buildings, factories, and naval vessels all use AC, however, because AC does not have a presence that can be readily detected by the five senses, AC poses risks of injury and even death to workers in those environments who may unwittingly come into contact with an exposed source of AC. For example, even though an electrician working on a power distribution panel may have been told that power has been turned off, another worker may have subsequently reenergized the panel. As another example, a power line may have been downed by a windstorm, and a first responder will have no idea whether or not the power line remains "live." As another example, a plumber repairing a broken copper pipe may be unaware that elsewhere in the building an exposed wire has come into contact with a distant end of the same copper pipe. Every year, there are thousands of accidental electrocutions in occupational settings, making electrical injuries the fourth-leading cause of workplace-related traumatic death.

In order to detect the presence of AC, workers may use non-contact AC voltage detectors which detect the changing electric and magnetic fields around an AC-carrying conductor. The technology behind non-contact AC voltage detection is well-understood and commercial hand-held detectors are readily available in the marketplace. However, commercially-available hand-held detectors are inconvenient in that they require the user to remove the detector from a toolbox or pocket, bring the detector probe(s) near the conductive material, and then return the detector to the toolbox or pocket. This inconvenience may transform into actual risk of accidental electrocution. For example, at the beginning of the job, an electrician may confirm, using a hand-held detector, that a circuit box is not energized. However, during the course of work on the circuit box, there is a risk that someone may reconnect power to the circuit box. While best practices may require the electrician to check periodically for the presence of live voltage, as a practical matter, the electrician may choose not to follow best practices or may simply forget to check for the presence of live voltage as frequently as necessary.

What is needed, therefore, is a non-contact AC voltage detector that is incorporated into something that the worker would be carrying or wearing as part of the course of performance of the work. One choice might be something that the worker may be wearing on the hand, such as a glove. However, a voltage detector that has been incorporated into a glove will be of value to a worker only if the glove itself is still useful for its primary purpose, namely use as an article of clothing that protects the hand and/or provides additional grip strength for picking up and holding articles. In practice, producing such a glove that is useful both as a glove and as a voltage detector has proven elusive. By way of example, U.S. Pat. No. 10/247,763 discloses a "voltage detecting glove" which requires an aerial/antenna component that extends around the tip of a glove finger. While such a design may increase performance of the glove as a voltage detector, it also decreases the performance of the glove as an actual glove. As a second example, U.S. Pat. Pub. 20160209448 discloses a "voltage detector safety glove" which is little if anything more than a conventional non-contact voltage detector that has been attached to a pocket sewn into a conventional glove. However, this design does not appear to take into account any effect that the human body will have on the quality and strength of the detected signal. As a third example, WO 2014158030 discloses an "electrical energy detection glove" that uses a wire loop antenna integrated into the back of the hand and/or fingers. However in practice, a wire loop antenna has a number of drawbacks: it requires close (and potentially dangerous) proximity to detect nearby AC voltage, the detected signal will likely lose strength as it passes through the loop, and the disclosed design will have a single point of failure.

Thus what is needed is a voltage detector design that lends itself to incorporation into existing glove designs without adversely affecting either the performance of the voltage detector or the performance of the glove.

SUMMARY OF THE INVENTION

Embodiments of the inventive glove solve the problem of incorporating an AC voltage detector into an everyday work glove without adversely affecting the performance of the glove. More particularly, embodiments of the inventive glove use thin, lightweight monopole aerials extending into the top of each of the glove fingers. The aerials are separated from the user's fingers with a thin layer of dielectric material acting as an electrical barrier. This provides suitable sensitivity, from a safe distance, to any nearby AC voltage, it does not require the user to hold the glove at a particular angle to the conductive material, and the AC voltage detector will continue to function even if some of the aerials cease to function because of normal wear and tear or physical impact.

Further, embodiments of the inventive glove include AC voltage detection and alerting circuitry connected to the aerials. This circuitry provides, at a minimum, the capability to detect the presence of AC voltage, eliminate background noise, and alert the user to the presence of dangerous AC voltage. The circuitry includes a ground connection in physical contact with the user's body, making the detection circuitry more sensitive to the presence of AC voltage. This increased sensitivity allows for the use of a thinner dielectric layer separating the aerials from the user's hand, which in turn avoids unnecessary stiffening of the glove and decreasing its usefulness as a glove.

Further, in some embodiments, the detection circuitry may include a microcontroller or microprocessor, non-volatile memory, an accelerometer, a GPS receiver, a motion-powered charger, visual, audio, and/or haptic alert components, and wired or wireless communications interfaces. Such additional components, while not necessary for the detection of AC voltage, provide additional beneficial convenience and operational features to the inventive glove.

Upon review of the drawings and detailed descriptions that follow, those skilled in the art will recognize other alternative embodiments of the inventive glove.

DETAILED DESCRIPTION OF THE INVENTION

The inventive glove may be implemented in a variety of embodiments, including the following first embodiment which provides sufficient details so as to enable a person of ordinary skill in the art to make and use the invention without extensive experimentation, as well as variations on this first embodiment that may prove beneficial for certain applications and configurations.

For purposes of explaining the various embodiments of the inventive glove, this disclosure will refer to portions of the glove using terminology corresponding to terminology commonly associated with the human hand, including "fingers" (corresponding to the phalanges), a "palm" (corresponding to the palmar side of the carpals and the metacarpals), a "back" (corresponding to the dorsal side of the carpals and the metacarpals), and a wrist (corresponding to the carpals and the joint between the carpals and the radius). Further, a glove finger has a portion that when worn is adjacent to the palmar side of the hand and another portion that is adjacent to the dorsal side of the hand; for purposes of identification, this disclosure uses "bottom" and "top" to denote the palmar and dorsal sides of the glove fingers. Further, a glove has an interior portion (that is, the side that is most adjacent to the user's hand) and an exterior portion (that is, the side that faces the external elements); for purposes of identification, this disclosures uses the terms "inner" and "outer" to denote the interior and exterior portions of the glove.

First Embodiment

Figure 1:
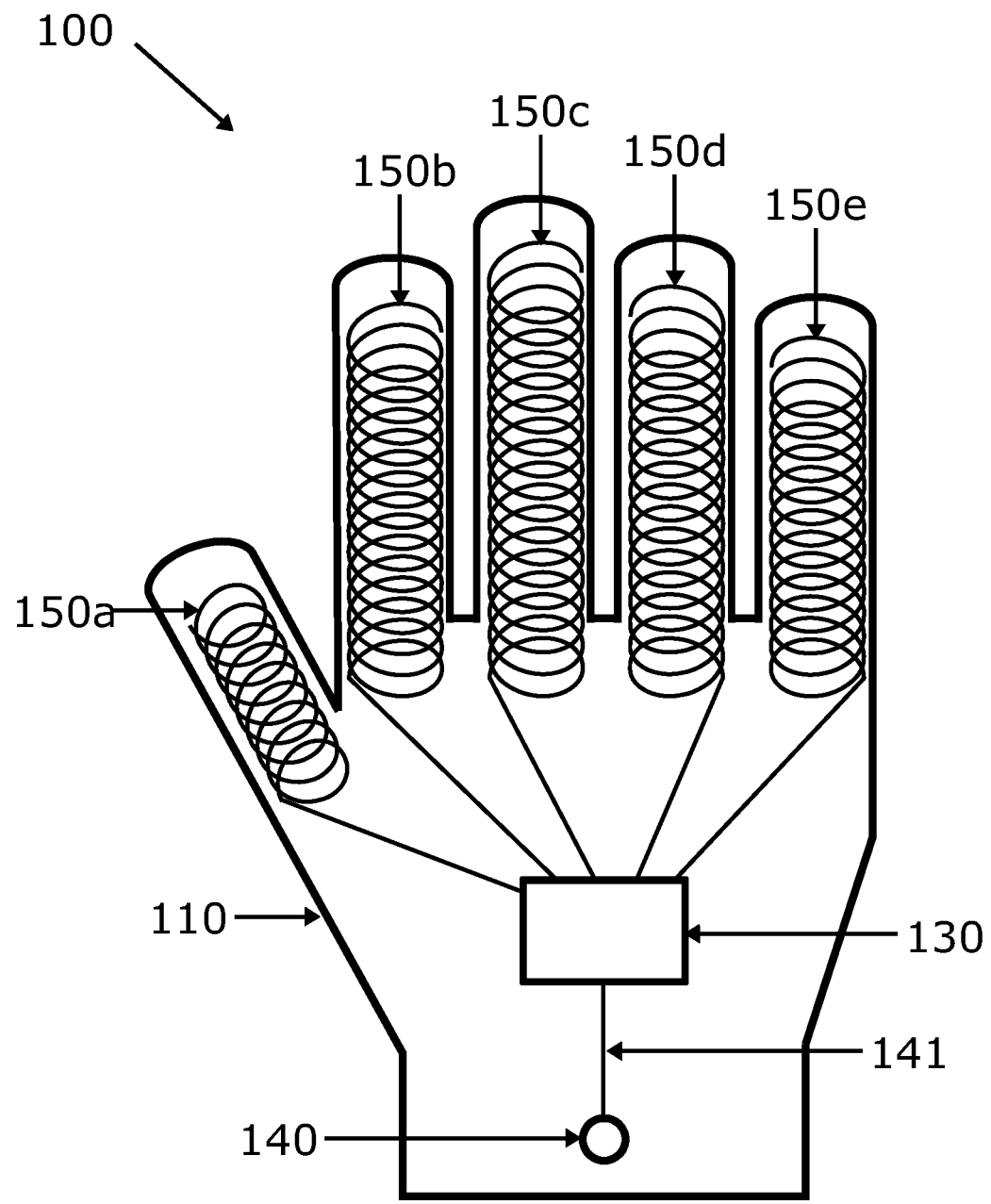
FIG. 1 is a cutaway view of the top side of an embodiment of the inventive glove.
Figure 2:
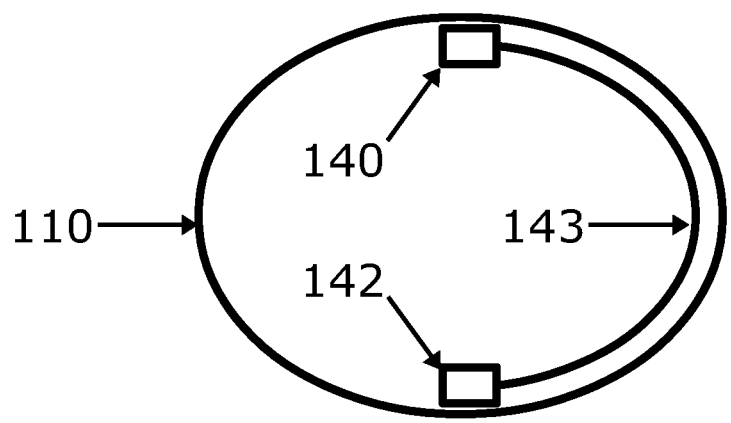
FIG. 2 is a cutaway view of the wrist portion of an embodiment of the inventive glove.
Figure 3:
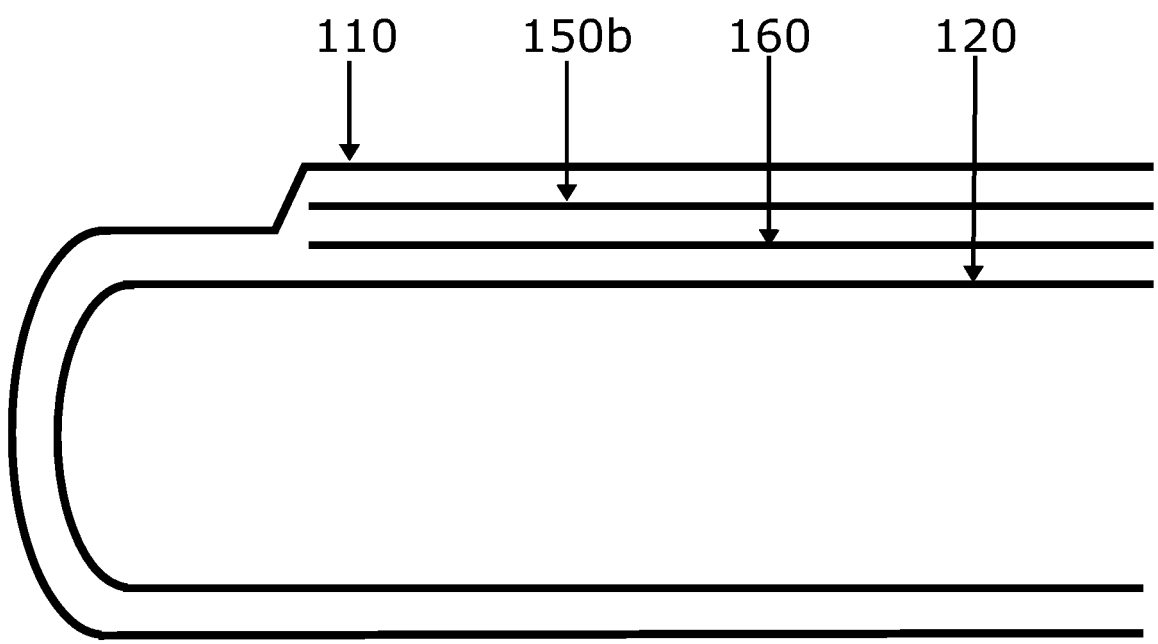
FIG. 3 is a cutaway view of the side of the index finger portion of an embodiment of the inventive glove.

In a first embodiment of the inventive glove, glove 100 comprises outer layer 110, inner layer 120, circuit board 130, ground buttons 140 and 142 (connected via wires 141 and 143), a plurality of monopole aerials 150a, 150b, 150c, 150d, and 150e (collectively aerials 150), and dielectric layer 160. FIGS. 1, 2, and 3 show various views of glove 100.

Each of aerials 150 comprise about 3 meters of 40 gauge polyurethane-insulated copper Litz wire, with the bulk of the wire arranged in a coil lying flat on the top side of each finger of the glove, with a short, generally straight, wire segment extending towards and connects to circuit board 130. The coiled portion is about 18 mm wide, and the total length of the coiled segment plus the straight segment of aerials 150b, 150c, 150d, and 150e is about 100 mm; the total length of the coiled segment and the straight segment of aerial 150a (the thumb) is about 70 mm. When worn, the flattened coils will bend slightly to fit the shape of the user's finger, and the coiled portion of each of aerials 150 will extend from around the knuckle of each user's finger to the tip of each user's finger. However importantly, when worn, no portion of any of aerials 150 extends beyond the user's fingertips so that the presence of the aerials will not interfere with use of the glove for typical work-related activities such as picking up and holding objects.

Ground buttons 140 and 141 comprise conductive material and are intended to contact the skin of the user's hand at the user's wrist when worn. As such, glove 100 includes a Velcro wrist strap (not shown) to secure the glove 100 such that the inner sides of ground buttons 140 and 142 make electrical contact with the user's hand. Ground button 140 is electrically connected to circuit board 130 via wire 141 and to ground button 142 by wire 143. Ground button 140, ground button 142, and wire 143 are sewn to the inner side of outer layer 110 at the wrist of glove 100, such that at least a portion of the ground buttons 140 and 142 are exposed to the user's wrist through openings in inner layer 120.

Aerials 150 are positioned into the fingers of glove 100 between dielectric layer 160 and outer layer 110, and are mechanically attached to dielectric layer 160 with adhesive. Dielectric layer 160 is 3 mm neoprene which prevents leakage of any AC voltage detected by aerials 150 into the user's hand. Dielectric layer 160 extends through the top side of each finger of glove 100 (under the coiled portions of aerials 150) and across the back of glove 100 (under aerials 150 and circuit board 130).

Outer layer 110 protects the user's hand, aerials 150, and circuit board 130 from mechanical risks, and is made from cowhide grain leather. Inner layer 120 comprises cotton material that provides user comfort and separates the user's hand from direct contact with circuit board 130 and dielectric layer 160. Outer layer 110 and inner layer 120 both follow the shape of a user's hand and are sewn together at the wrist portions of each as well as other portions as needed to keep inner layer 120 in a generally-fixed position within outer layer 110.

Figure 4:
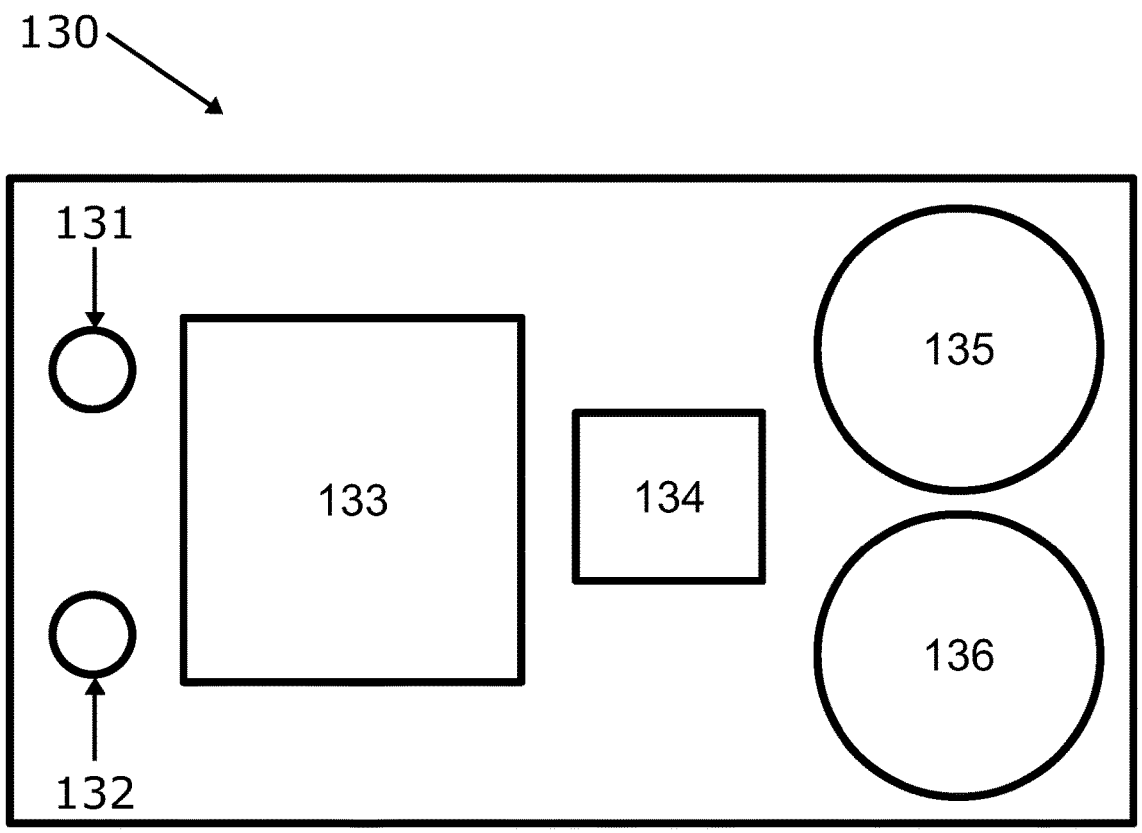
FIG. 4 is diagram of the logical layout of the circuit board in an embodiment of the inventive glove.

Circuit board 130 comprises conventional low-power electronics for processing signals from aerials 150. FIG. 4 shows the logical layout of circuit board 130, including aerial connector 131 (to which aerials 150 are connected), ground connector 132 (to which wire 141 is connected), AC voltage detection components 133 (which comprise various resistors, capacitors, transistors, traces, and the like, as needed to perform the functions described in block diagram 170), surface mount buzzer 134, and surface mount coin cell holders 135 and 136 (suitable for holding two CR2032 3 v coin cell batteries which provide power to circuit board 130). The components of circuit board 130 are physically arranged to provide optimal performance as would be known to one of ordinary skill in the art of designing circuit board layout.

Figure 5:
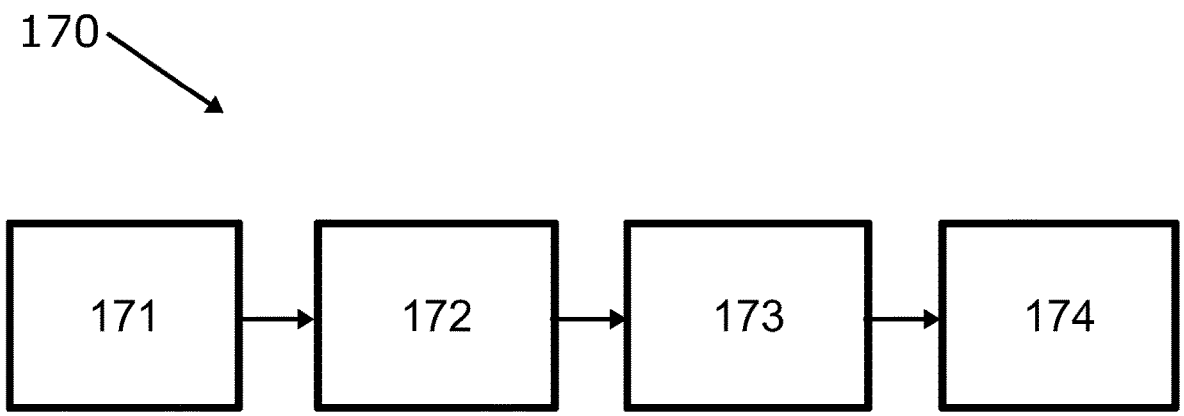
FIG. 5 is a Nock diagram of the functionality performed by the components of the circuit board in an embodiment of the inventive glove.

Block diagram 170, shown in FIG. 5, describes the functionality of the components of circuit board 130 when a signal arrives from aerials 150. The electrical signal from aerials 150 first passes through band pass filter 171, which eliminates very low and very high frequency signals, for example, low-frequency static fields and high-frequency fields caused by switch-mode power supplies. The signal output from band-pass filter 171 then passes through frequency comparator 172, which compares the filtered signal with a reference signal. When the filtered signal has a higher frequency than that of the reference signal, the output of comparator 172 is low, and when the filtered signal has a lower frequency than that of the reference signal, the output of comparator 172 is high. Thus, in the presence of a sufficiently strong AC voltage, the signal output from comparator 172 is a square wave with a frequency equal to that of the electrical signal received by aerials 150. This signal feeds into peak detector 173, which outputs a DC voltage equal to the peak value of the signal from comparator 172. The output of peak detector 173 drives the circuitry of audio annunciator 174 which emits an audible alert when it receives a sufficient signal. Thus, when aerials 150 are in proximity to commercial AC voltage, the detected voltage results in an audible alert from annunciator 174, and when aerials 150 are not in proximity to commercial AC voltage, annunciator 174 will remain silent.

ALTERNATIVE AND ADDITIONAL EMBODIMENTS

The inventive glove as described in the foregoing embodiment may be modified and/or extended by one of ordinary skill in the art without departing from the spirit of the inventive glove, so long as the glove (a) maintains its usefulness as a glove and (b) maintains its ability to detect AC voltage at a safe distance. Selection of some of these modifications and extensions may affect the quality of the general operation of the inventive glove in terms of performance when used for particular applications. Other modifications and extensions may be driven by costs of manufacture, availability of materials, physical constraints, and other factors which may be independent of the general operation of the inventive glove. The following variations represent a non-exclusive description of examples of other embodiments which may be mixed and matched as needed and as technically feasible without affecting the general functionality of the inventive glove.

In some embodiments, outer layer 110 comprises material suitable for use in specific applications. For example, outer layer 110 may comprise natural or synthetic materials, including cotton, wool, canvas, rubber, latex, nylon, neoprene, nitrile, polyvinyl, polyethylene, silk, Kevlar, metal fiber, and the like, along with blends of such materials. Further, outer layer 110 may further comprise outer coatings such as polyurethane, Teflon, nitrile, and latex. Further, a portion of outer layer 110 may comprise one material while another portion may comprise other materials, for example, the front side of the fingertips of glove 100 may comprise material that enhances the user's grip, while the wrist portion may be made from flexible material that enhances the fit of glove 100.

In some embodiments, inner layer 120 comprises material suitable for use in specific applications. For example, inner layer 120 may comprise nature or synthetic materials, including silk, wool, leather, and the like, along with blends of such materials. Further, in some embodiments, inner layer 120 is fully attached to outer layer 110 using thread, adhesive, or other suitable means commonly known to those of ordinary skill in the art. Further, in some embodiments, there may be a layer between outer layer 110 and inner layer 120 comprising a lightweight thermal insulating material.

In some embodiments, the length, configuration, and composition of aerials 150 may vary provided that (a) aerials 150 remain sufficiently sensitive to AC voltage at a safe distance and (b) the variations do not hinder the usability of the glove in terms of weight and/or flexibility. For example, aerials 150 may comprise thinner or thicker gauges of wire and may comprise solid (non-Litz) wire. Further, aerials 150 may be arranged in a configuration other than in overlapping coils, for example the wires may be positioned in side-by-side runs that are parallel, orthogonal, or diagonal with respect to a line between the knuckle and fingertip portions of glove 100. Further, the length and configurations of aerials 150 may be tuned for optimized performance for a particular frequency of AC voltage. Further, aerials 150 may comprise a flexible printed circuit within a single or multilayer flexible dielectric substrate such as polyimide or polyester. Further, the total wire length of aerials 150 may vary according to the size of the gloves and lengths of the glove fingers.

In some embodiments, there may be a single ground contact and it may be located elsewhere on glove 100, for example, as a ground button positioned on the front or back side of the wrist, or there may be multiple ground buttons at various locations designed to make contact with the user's hand. Further, the ground contact may be a ribbon, rivet, or strip of conductive material positioned to make contact with the user's hand, for example, by surrounding the wrist of the glove. Further, the ground contact may also function as a snap, button, hook, or zipper used to adjust the fit of glove 100. Further, the ground contact may be glued, sewn, or riveted in place.

In some embodiments, glove 100 may be secured to the user's wrist using means suitable for the application of glove 100. For example, it may be secured using elastic sewn into or otherwise attached to the wrist of glove 100, adjustable straps, snaps, or stretchable material.

In some embodiments, dielectric layer 160 may comprise thicker or thinner neoprene or other flexible dielectric material, provided that the thickness or composition of the material does not adversely affect the weight or flexibility of glove 100. Further, dielectric layer 160 may comprise a coating or paint which enhances its dielectric properties while allowing for use of a thinner material.

In some embodiments, annunciator 174 may provide other alert mechanisms instead of or in addition to an audible alert. For example, annunciator 174 may comprise multiple LEDs that indicate different conditions, such as solid green for "detector functioning, no danger" and flashing red for "danger." Further, the audible alert could change pitch or volume in proportion to the proximity and/or strength of the AC voltage. Further, annunciator 174 may include a haptic indicator that vibrates when dangerous AC voltage is detected; such an indicator may prove useful in noisy environments.

In some embodiments, the functionality provided by some or all of the components of printed circuit board 130 could be performed by an application-specific integrated circuit (ASIC). Use of an ASIC could reduce the footprint of the circuitry mounted on printed circuit board 130 and thus reduce the size and weight of printed circuit board 130.

In some embodiments, the functionality provided by some or all of the components of printed circuit board 130 could be performed by a low-power microcontroller. Use of a programmable microcontroller could, for example, provide better analysis of detected signals to reduce false positives, provide a greater degree of customizable features such as optimizing glove 100 for particular operating environments, extracting additional information about detected signals such as strength, frequency, and harmonic distortion, and logging of significant events in the microcontroller's non-volatile memory for later access. Significant events may include, for example, the detection of dangerous voltage, power on/off, configuration changes, recalibration, and the like. Further, the addition of a GPS receiver to circuit board 130 could provide location to the information logged about significant events. Further, the presence of a programmable microcontroller could simplify external connectivity as described in the following paragraph.

In some embodiments, circuit board 130 further comprises communications hardware for connecting glove 100 to an external device such as a portable computer, smart phone, or computer network. The communications hardware may include a wired connector, such as a USB or Lightning port, or it may include wireless radio transceiver suitable for use with Bluetooth, ZigBee, IEEE 802.11x, or other wireless protocols. The presence of a microcontroller as part of the circuitry present on circuit board 130 simplifies external communications since such microcontrollers may include integrated transceivers and embedded protocol stacks. Glove 100 may transmit the occurrence of significant events to the external device in real time, for example to provide instantaneous reports to the worker's supervisor, or in non-real time, for example, at the end of the workday when glove 100 is plugged into the external device for recharging. Further, the external device could send configuration, software updates, and other operational information to the microprocessor via application software running on the external device.

In some embodiments, the power source for circuit board 130 may comprise rechargeable batteries, which can be recharged by physical connection of glove 100 to a power source, for example, via a USB cable, by placing glove 100 in proximity to a wireless charging pad, by a kinetic energy charger incorporated into glove 100, or by the electric field that glove 100 is designed to detect. In the latter embodiment, an energy storage circuit would be required to store small amount of energy collected by the electric field.

In some embodiments, the signals received via aerials 150 at circuit board 130 could be conditioned prior to passing through band pass filter 171. By way of example, such conditioning may include the use of a large resistor connected to ground to ensure that the input to band pass filter 171 remains low except in the absence of AC voltage. Circuit board 130 may also include components to match the impedance of aerials 150 in order to maximize signal received by band pass filter 171.

In some embodiments, the signals received via aerials 130 could be individually processed and analyzed; such individual signal processing could provide, for example, additional information about the physical position of the AC voltage with respect to aerials 150.

In some embodiments, it may be useful for the ends of the glove fingers to be exposed, for example, to allow the user to have physical contact with some external device such as a computer touch-screen. In such embodiments, the finger portions of outer layer 110, inner layer 120, and dielectric layer 160 will not extend to the fingertips. Aerials 150 may be shortened, at the expense of lowered sensitivity, or alternatively, to maintain sensitivity, the coiled portions of aerials 150 may extend into the back portion of glove 100 or may be coiled more densely.

In some embodiments, the functionality of the components of circuit board 130 may be configurable, either manually or dynamically. For example, in the U.S., the AC voltage is 60 Hz while in Australia, AC voltage is 50 Hz. A manual switch on glove 100 could change the circuitry from one frequency to another, or alternatively, the circuitry could be automatically configured to the proper frequency by holding glove 100 near an active AC voltage conductor.

In some embodiments, an additional aerial, configured to transmit an AC voltage signal, could be incorporated into glove 100. This would allow the components of circuit board 130 to be tested periodically to confirm proper operation.

In some embodiments, a low-voltage detection circuit could be incorporated in the components of circuit board 130. This could alert the user that power source (for example, the on-board batteries) were too weak for proper operation.

In some embodiments, a motion detector, such as an accelerometer, could sense when glove 100 was not in use and put the components of circuit board 130 into a low power sleep mode; the motion detector could also sense when glove 100 was in use, putting the components of circuit board 130 back into normal operation mode. In other embodiments, glove 100 may include a power switch that allows the user to turn the power to circuit board 130 on and off.

The invention claimed is:

1. A non-contact AC voltage detecting glove, comprising:
an outer layer in the shape of a human hand and comprising a hack, a wrist, a palm, and a plurality of fingers, each of the fingers comprising a top portion and a bottom portion;
an inner layer in the shape of a human hand comprising a back, a wrist, a palm, and a plurality of fingers, each of the fingers comprising a top portion and a bottom portion, where the inner layer fits inside the outer layer;
a flexible dielectric layer positioned between the top portion of each finger of the outer layer and the top portion of each finger of the inner layer, and between the back of the outer layer and back of the inner layer;
a circuit board positioned between the dielectric layer and the back of the outer layer and comprising a low hand pass filter, a high hand pass filter, a voltage detector, a power supply, an annunciator, a ground connector, and an aerial connector;
a plurality of monopole aerials each comprising a coiled portion and a non-coiled portion, positioned between the dielectric layer and the outer layer, and connected on one end to the aerial connector, where each aerial extends into each finger of the outer layer and terminates before the distal end of each finger of the outer layer; and
a ground contact comprising conductive material, connected to the ground connector and positioned at the wrist of the inner layer such that when the glove is worn by a user, the ground contact makes electrical contact with the user's hand,
where the annunciator is configured to alert the user of the glove when the voltage detector detects a proximity of an AC voltage to the aerials.

2. The glove of claim 1,
where each of the aerials comprises at least 3 meters of 40-gauge Litz wire.

3. A non-contact AC voltage detecting glove, comprising:
an outer layer in the shape of a human hand and comprising a back, a wrist, a palm, and a plurality of fingers, each of the fingers comprising a top portion and a bottom portion;
an inner layer in the shape of a human hand comprising a back, a wrist, a palm, and a plurality of fingers, each of the fingers comprising a top portion and a bottom portion, where the inner layer fits inside the outer layer;
a flexible dielectric layer positioned between the top portion of each finger of the outer layer and the top portion of each finger of the inner layer, and between the back of the outer layer and back of the inner layer;
a circuit board positioned between the dielectric layer and the back of the outer layer and comprising a low band pass filter, a high band pass filter, a voltage detector, a power supply, an annunciator, a ground connector, and an aerial connector;
a plurality of monopole aerials comprising a flexible printed circuit positioned between the dielectric layer and the outer layer, and connected to the aerial connector, where the flexible printed circuit extends into each finger of the outer layer and terminates before the distal end of each finger of the outer layer; and a ground contact comprising conductive material, connected to the ground connector and positioned at the wrist of the inner layer such that when the glove is worn by a user, the ground contact makes electrical contact with the user's hand, where the annunciator is configured to alert the user of the glove when the voltage detector detects a proximity of an AC voltage to the aerials.

4. The glove of claim 3,
where the dielectric layer comprises neoprene between 0.25 mm and 6.00 mm in thickness.

5. The glove of claim 3,
where the circuit board further comprises a motion detector configured to put the circuit board into a low-power mode from a normal power mode after an extended period without detection of movement, and configured to put the circuit board into the normal power mode from the low-power mode upon detection of movement.

6. The glove of claim 3,
where the ground contact comprises a plurality of interconnected ground buttons.

7. The glove of claim 3,
where the ground contact comprises a strip of conductive material.

8. The glove of claim 3,
where the outer layer and inner layer of each finger fully enclose the distal end of each finger.

9. The glove of claim 3,
where the outer layer and inner layer of each finger do not fully enclose the distal end of each finger such that when the user's hand is inserted into the glove, the user's fingertips are not covered by the outer layer or the inner layer.

10. The glove of claim 3,
where the low band pass filter, high band pass filter, and voltage detector are implemented using discrete circuits.

11. The glove of claim 3,
where the circuit board further comprises an application-specific integrated circuit (ASIC), and
where at least one of the low band pass filter, high band pass filter, and voltage detector are implemented on the ASIC.

12. The glove of claim 3,
where the circuit board further comprises a microcontroller,
where the microcontroller comprises a processor and non-volatile memory, and
where the non-volatile memory comprises software instructions for performing and storing results of calculations related to implementation of at least one of the low band pass filter, high band pass filter, and voltage detector.

13. The glove of claim 3,
where the annunciator emits a sound to alert the user of the proximity of the AC voltage.

14. The glove of claim 3,
where the annunciator displays a visual indicator to alert the user of the proximity of the AC voltage.

15. The glove of claim 3,
where the annunciator provides a haptic indicator to alert the user of the proximity of the AC voltage.

16. The glove of claim 3,
where the circuit board further comprises a microcontroller,
where the microcontroller comprises a processor, non-volatile memory, and a transceiver, and
where the non-volatile memory comprises instructions for performing communications with an external device using the transceiver.

17. The glove of claim 3,
where the outer layer consists of one or more materials selected from the group consisting of leather, cotton, wool, canvas, rubber, latex, nylon, neoprene, nitrile, polyvinyl, polyethylene, silk, Kevlar, polyurethane, Teflon, and metal fiber, and
where the inner layer consists of one or more materials selected from the group consisting, of cotton, silk, wool, and leather.

18. The glove of claim 3,
where the flexible printed circuit comprises a dielectric substrate.

19. The glove of claim 3,
where the flexible printed circuit comprises conductive material configured as a plurality of interconnected side-by-side runs that are orthogonal with respect to a line running the length of each finger.

20. The glove of claim 3,
where the dielectric layer comprises neoprene between 1.0 mm and 1.5 mm in thickness.

* * * * *